United States Patent [19]

Becker

[11] 4,387,465
[45] Jun. 7, 1983

[54] SEQUENTIAL THRESHOLD DETECTOR

[75] Inventor: James C. Becker, Lawndale, Calif.

[73] Assignee: TRW Inc., Redondo Beach, Calif.

[21] Appl. No.: 253,331

[22] Filed: Apr. 13, 1981

[51] Int. Cl.³ .................... H03K 17/30; H04B 15/00
[52] U.S. Cl. ........................................ 375/1; 307/356; 307/352; 328/149; 375/76
[58] Field of Search ............. 307/350, 530, 352, 353, 307/354, 356, 360; 328/135, 146, 149, 162, 150; 343/5 PN; 375/1, 76, 94, 96, 116

[56] References Cited

U.S. PATENT DOCUMENTS

| | | | |
|---|---|---|---|
| 3,896,395 | 7/1975 | Cox | 328/149 |
| 4,122,393 | 10/1978 | Gordy et al. | 375/1 |
| 4,161,628 | 7/1979 | McRae | 375/76 |

Primary Examiner—Benedict V. Safourek
Attorney, Agent, or Firm—Donald R. Nyhagen; Robert W. Keller

[57] ABSTRACT

An improved sequential threshold detection circuit for use in the receiver of a spread-spectrum communication system is disclosed wherein the improvement resides in the employment of a feedback circuit for maintaining a pre-selected constant median dismissal time. In the preferred embodiment the feedback circuit comprises a flip-flop (70), a very long time constant integrator (72), and a one-shot (74) connected between a comparator (64) and a summing amplifier (60) for varying a threshold bias voltage applied to the summing amplifier. In an alternative embodiment, the feedback circuit serves to selectively vary the gain of a variable gain amplifier (110) in such a manner to vary the individual trial and error dismissal times to provide a substantially constant median dismissal time over the entire detection process.

The detection circuit of the invention provides a signal indicating whether the pseudo-random noise generator (26) in the system receiver (9) has been synchronized to the pseudo-random noise generator (16) in the system transmitter (8), but does so with improved reliability, accuracy and statistical performance with reduced manufacturing cost.

12 Claims, 12 Drawing Figures

SEQUENTIAL THRESHOLD DETECTOR

TECHNICAL FIELD

The present invention relates generally to communication systems, and more specifically, to an improved sequential detection circuit primarily adapted for use in a receiver for demodulating pseudo-random-noise-generated spread spectrum signals.

BACKGROUND ART

Communication systems that utilize spread spectrum modulation and demodulation for security of transmission have been available. The article entitled "Spread Spectrum Modulation" by M. D. Egtvedt, of the text entitled "Electronics Engineers Handbook" published by McGraw-Hill in 1975 beginning at page 14-51 is exemplary of one such communication system. A spread spectrum is formed by modulating an RF signal with a pseudo-random noise (PRN) digitally coded signal. Typically, an RF transmitter includes a pseudo-random noise generator the output signal of which modulates the RF signal by a code of known sequence. A corresponding generator at a receiver, having an identical code sequence, generates a signal to demodulate the spread spectrum signal when the two codes are correlated by being in proper time synchronization. In such spread spectrum communication systems a threshold detector is employed to adjust the time relationship between the signals of the pseudo-random noise generators in the receiver and transmitter, respectively by a trial and error procedure which steps the time sequence of the pseudo-random noise code generator until correlation is detected between the received code and the receiver-generated code.

One well-known apparatus for providing threshold detection is known in the art as a fixed integration-time detector. Another threshold detector in the prior art is known as a sequential threshold detector which has certain performance advantages relative to the fixed integration-time device.

Sequential threshold detectors depend on the application of a very stable bias voltage signal to a differential amplifier for subtraction from the incoming signal after the PRN code signal is applied for demodulation. The difference signal is then applied to an integrator and comparator where it is first integrated and then compared with a negative threshold voltage. If the two PRN codes are in synchronization, the output voltage of the integrator will not exceed a selected negative threshold voltage during a given period of time, commonly referred to as the truncation time. If the PRN generator in the receiver is not synchronized to the PRN generator in the transmitter, the integrator output voltage exceeds the selected negative threshold voltage indicating that a lack of correlation exists between the two codes. When the integrator output voltage exceeds the selected negative threshold voltage, the integrator is reset for another attempt at acquisition with the receiver's PRN generated code shifted in time sequence for the new trial.

Important performance parameters for sequential threshold detectors are, probability of detection, probability of false alarm and median or mean dismissal time. The dismissal time is the time it takes the integrator output signal to reach a selected threshold voltage when a condition of noncorrelation is known to exist. These performance parameters are dependent upon the selected truncation time, threshold voltage, bias voltage, and upon the signal-to-noise ratio environment in which the receiver must operate. Typically, a sequential threshold detector circuit is designed so that the truncation time, threshold voltage, and bias voltage provide optimum performance parameters for a given minimum signal-to-noise ratio.

A prior art scheme for implementing sequential threshold detectors uses a highly stable, constant DC voltage as a threshold source and an accurate digital counter to determine truncation time. In this scheme, the bias voltage is established by sampling the incoming signal when correlation is known to be absent, and thereafter averaging and multiplying the sampled signal by a fixed gain to develop the bias voltage. However, such a scheme is susceptible to errors because of instability and inaccuracy of the bias voltage. Unfortunately, such instability and inaccuracy is difficult and expensive to avoid. In addition, conventional circuits that are used to subtract the bias voltage from the incoming signal, as well as circuits used for the integrator, develop DC offset voltages that create errors in the detector and, therefore, reduce performance from the designed optimum. Such DC offset voltages also occur in the bias voltage generating circuit within the detector and can become quite significant due to aging of components and changes in ambient temperature. In prior art sequential threshold detectors, reduced performance of the detector results from DC offset voltages. Consequently, more costly components and longer manufacturing time are required to achieve optimum performance despite component aging and ambient temperature variation.

The present invention utilizes a novel feedback circuit for selectively biasing or amplifying the incoming signal, to result in a substantially constant median dismissal time, at some optimized value. The result is a substantial improvement over prior art sequential detection circuits which substantially overcomes the aforementioned disadvantages of prior art sequential threshold detectors.

Although adaptive devices for receivers have been disclosed in the prior art, (see for example, U.S. Pat. No. 3,599,105 to Wear et al.) a sequential threshold detector that utilizes a feedback circuit for varying the bias or gain applied to the incoming signal to provide a substantially constant median dismissal time is not available. Other prior art detection devices are disclosed in U.S. Pat. No. 3,828,204 to Farnsworth and in U.S. Pat. No. 4,086,651 to Muir et al., but such devices do not utilize the novel feedback circuit of the present invention.

SUMMARY OF THE INVENTION

The present invention comprises a novel sequential threshold detection apparatus for varying the bias voltage subtracted from the incoming signal. In one embodiment of the invention, the detection apparatus generates a voltage for adjusting the gain of an amplifier to which the incoming signal is input. The detection apparatus is capable of maintaining a substantially constant median dismissal time at some pre-selected optimized value. The measured dismissal time is compared to a highly accurate representation of the desired optimum median dismissal time. If the measured dismissal time is less than the desired median dismissal time, the feedback voltage is adjusted in a direction to increase the dismissal time. Conversely, if the measured dismissal time exceeds the desired value, the feedback voltage is adjusted in the opposite direction to reduce dismissal time. In this manner the median of dismissal times over a long time interval is maintained substantially constant.

In one embodiment of the invention, the detection apparatus utilizes a comparator, integrator, one shot, summing amplifier, and a feedback circuit comprising a bistable multivibrator or flip-flop having an input terminal connected to the output of the comparator, an output terminal connected to the input of an additional integrator having a very long time constant, and a clock terminal connected to the output terminal of the one-shot. The one-shot is triggered when the dismissal time is to be measured. The output of the very long time constant integrator provides a bias voltage to a first input terminal of the summing amplifier, or differential amplifier, which has a second input terminal for receiving an incoming signal.

In a second embodiment of the present invention, an amplifier is located in the path of the incoming signal. The signal output from the very long time constant integrator is applied as a gain control to the amplifier. A fixed bias potential is applied to the differential amplifier along with the amplifier incoming signal. The novel feedback circuit varies the gain control signal voltage to provide substantially constant, optimum median dismissal time for satisfactory detector performance irrespective of component aging, ambient temperature variation and other sources of changing circuit characteristics.

It is therefore a primary object of the present invention to provide an improved sequential threshold detector for use primarily in a receiver of a pseudo-random noise modulated spread-spectrum communication system.

It is a further object of the present invention to provide a sequential threshold detector primarily adapted for use in pseudo-random noise spread-spectrum receivers, which employs a novel feedback circuit for adjusting dismissal time within each code synchronization attempt and thus provides a substantially constant optimum median dismissal time over the detection process.

BRIEF DESCRIPTION OF THE DRAWINGS

In addition to the above-noted objects, others will become evident hereinafter as a result of the following description of preferred embodiments of the invention described by way of example and illustrated in the accompanying drawings in which.

DETAILED DESCRIPTION OF PREFERRED EMBODIMENTS

Figure 1:
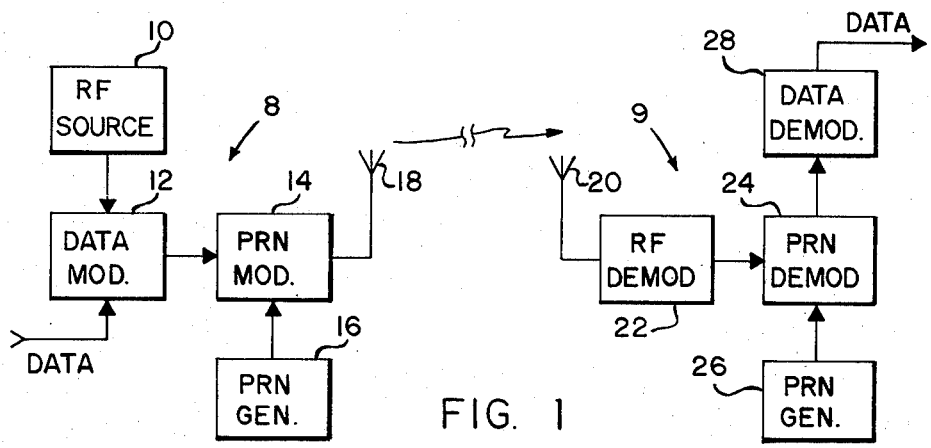
FIG. 1 is a simplified block diagram illustration of a pseudo-random noise spectrum-spread communication system in which the present invention is utilized.

As illustrated in FIG. 1, a spread-spectrum communication system comprises an RF transmitter 8 and an RF receiver 9. The transmitter 8 includes an RF source 10, a data modulator 12, a (PRN) modulator 14, a PRN generator 16 and a transmitting antenna 18. Receiver 9 comprises a receiving antenna 20, an RF demodulator 22, a PRN demodulator 24, a PRN generator 26, and a data demodulator 28. Data modulator 12 imparts data modulation onto the RF signal in a well-known manner. PRN modulator 14 imparts additional modulation provided by PRN generator 16 onto the data-modulated RF signal. PRN generator 16 provides an apparently random sequence of binary signals, that is, signals having a logical value of either 0 or 1. Typically, the sequence of binary signals is presented in a non-return-to-zero format. Each time the logic level of the signal generated by PRN generator 16 changes state, PRN modulator 14 produces a phase reversal that is 180° shift in phase of the data-modulated signal output from data modulator 12.

The resulting signal, which comprises an RF sinewave modulated by both data and pseudo-random noise, and which may in some cases be a suppressed carrier type signal, is applied to a transmitting antenna 18 which radiates it to the receiving antenna 20 at the location of the receiver 9.

Antenna 20 is connected to RF demodulator 22 which converts the incoming signal to a lower frequency of an intermediate state or to the frequency of the modulating signals. The output of RF demodulator 22 is applied to PRN generator 26. The PRN demodulator 24 also reverses the phase of the incoming signal. Consequently, when the signal generated by PRN generator 26 is in synchronization with the signal generated by PRN generator 16, (taking into account the transmission time delay between transmitter and receiver), the output signal from PRN demodulator 24 corresponds substantially to the signal originally input to PRN modulator 14 in transmitter 8. When the aforementioned synchronization and correspondence are achieved, the output signal of the PRN demodulator 24 has, ideally, all vestige of a pseudo-random noise modulation removed. Data demodulator 28, thus provides a relatively clean data signal at the data output.

Figure 2:
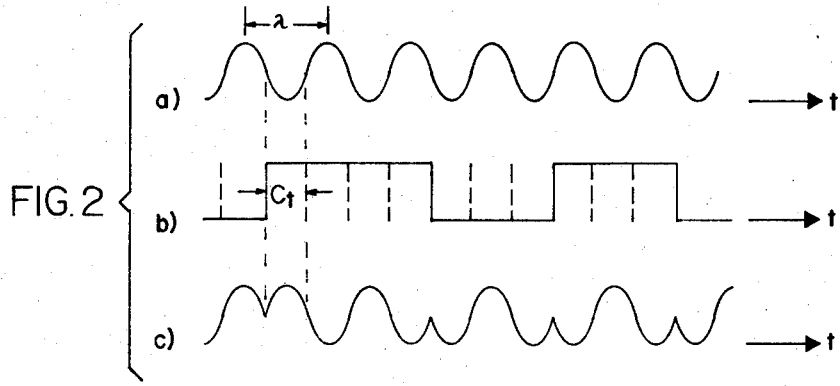
FIG. 2 is a graphical illustration of various waveforms generated in the system of FIG. 1.

FIG. 2 illustrates three waveforms, namely, waveform (a) which is a sinewave representative of the output of data modulator 12; waveform (b) which is a portion of the binary sequence representative of the output signal of PRN generator 16 corresponding in time to waveform (a); and waveform (c) which is a representative indication of the resultant signal at the output of PRN modulator 14 produced by the effect of waveform (b) on waveform (a). For purposes of clarity, the effect of the data modulator on the RF signal supplied by RF source 10 is ignored. Waveform (a) is a sinewave of wavelength λ which represents the unmodulated input signal to the PRN modulator 14 in the transmitter, as well as the corresponding unmodulated output signal from PRN demodulator 24 in the receiver. Waveform (b) is a non-return-to-zero format sequence of binary 1's and 0's of pulse width Ct. The time duration of Ct is also commonly referred to as a chip. The chip identified as Ct in waveform (b) of FIG. 2, is the first of four such pulse durations which comprise four bits of a binary 1 logic state. Those four bits in waveform (b) are followed by three chips or bits in a binary 0 state, which are, in turn, followed by three additional chips in a binary 1 state.

PRN modulator 14 and PRN demodulator 24, are each adapted to shift the phase of a signal, from the data modulator 12 and RF demodulator 22, respectively, by 180° to produce the output signal. Waveforms (a), (b), and (c) of FIG. 2 correspond to the input of PRN modulator 14, the output of PRN generator 16 and the output of PRN modulator 14, respectively. It will be observed that each time the logic level of the binary signal produced by the PRN generator 16 changes state, phase reversal occurs in the sinewave input to the PRN modulator, to thereby produce the corresponding output signal of PRN modulator 14 represented by waveform (c) of FIG. 2. The reverse process takes place in receiver 9, wherein the input signal to PRN demodulator 24 is, (ignoring the data modulation), represented by waveform (c). Similarly, the output of the PRN generator 26 is represented by waveform (b) when synchronized with the corresponding output signal of PRN generator 16 in the transmitter. The output of PRN demodulator 24 is represented by waveform (a), which is the fully demodulated RF signal.

Figure 3:
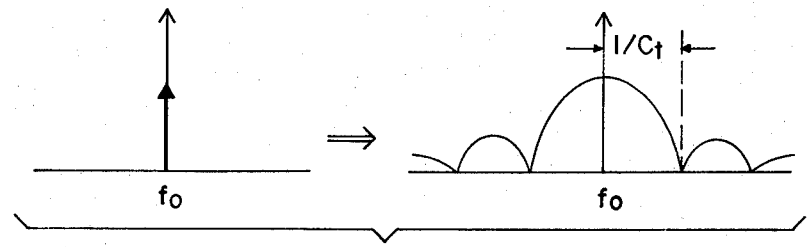
FIG. 3 is a graphical illustration of the spectrum spreading characteristics of the system of FIG. 1.

The spectral representation of the transition between waveform (a) and waveform (c) in FIG. 2, is represented in FIG. 3. The left graph of FIG. 3 shows a spectrum comprising the single sinewave frequency $f_0$. As a result of the modulation by the PRN signal represented by waveform (b), the spectrum is transformed to a spread-spectrum as shown on the right graph of FIG. 3. The spread-spectrum consists of a sine x/x characteristic in which the distance between $f_0$, the frequency of the sinewave, and the first null of the spectrum, is the inverse of a chip or pulse duration, namely 1/Ct. In receiver 9 the reverse transition takes place wherein the spread-spectrum of the right graph of FIG. 3 is compressed to the singular frequency characteristic illustrated in the left graph of FIG. 3.

As previously indicated, one of the possible problem areas associated with spectrum spreading communication systems is that such spreading increases the bandwidth of the data-modulated signal and thus decreases the signal power-to-noise density ratio in which the receiver must operate. This reduced signal power-to-noise density ratio makes more difficult the task of acquiring synchronization between the pseudo-random noise code generated in the receiver and the corresponding code generated in the transmitter. Thus, the receiver must be capable of conducting a process or algorithm which adjusts the time relationship between the PRN generator of the transmitter and the PRN generator of the receiver until synchronization is achieved. In addition, the receiver must be capable of conducting such a process or algorithm with a high probability of success and in a relatively short period of time despite the relatively low signal-to-noise ratio.

One well-known method for determining when the two PRN generator signals are synchronized utilizes the scheme of integrating the incoming signal over a fixed period of time, while constantly comparing the level of the integrated signal with a selected threshold voltage level. If the incoming signal has not been acquired, that is, if the two PRN generated codes are out of synchronization, the integral of the incoming signal fails to reach the selected threshold level over the fixed integration time because of the lack of correlation between the two codes. On the other hand, if there is correlation between the two codes, the output signal of the integrator exceeds the pre-selected threshold voltage level within the selected fixed integration time. The integrator output signal exceeds the threshold voltage level only when correlation exists, that is, only when the coded signal of the PRN generator of the transmitter and the coded signal of the PRN generator of the receiver are in synchronization.

Figure 4:
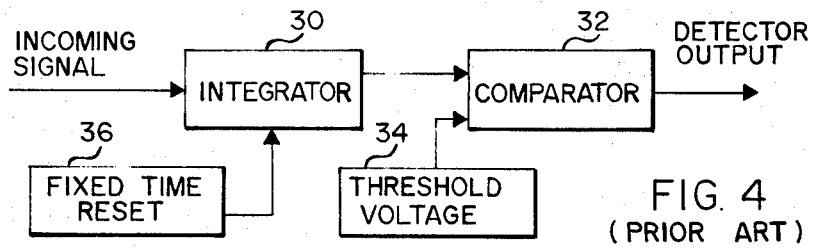
FIG. 4 is a simplified block diagram illustration of a prior art fixed integration-time detector.

A prior art apparatus for performing this correlation detection function is illustrated in block diagram form in FIG. 4. The detector of FIG. 4 comprises an integrator 30, a comparator 32, a threshold voltage source 34, and a fixed time reset generator 36. As shown in FIG. 4, an incoming signal (the output of PRN demodulator 24 of FIG. 1) is applied to integrator 30. The output signal of the integrator is applied to one input of comparator 32. The other input of comparator 32 is connected to the output of threshold voltage source 34. Fixed time reset generator 36 is connected to integrator 30 to reset the integrator after a selected period of time. The output signal from the integrator 30 is constantly compared to the threshold voltage from source 34 by comparator 32. Comparator 32 generates an output voltage of a first polarity or level as long as the integrator output signal is less than the output level of threshold voltage source 34. However, when the level of the output signal of integrator 32 exceeds the level of the threshold voltage source 34, the output signal of the comparator 32 suddenly changes to an alternative polarity or level to indicate the occurrence of that event.

Fixed-time reset generator 36 resets integrator 30 after fixed intervals of time which are related to the threshold voltage level provided by source 34 to produce optimum statistical performance of the apparatus of FIG. 4. Each time integrator 30 is reset and the integrator output signal has not reached or exceeded the threshold voltage, indicating that no correlation exists, the code timing is changed by shifting its time sequence by a given amount, such as a one-half chip, or, in other words, one-half Ct. The prior art detector of FIG. 4 continues this integration and comparison process, until the pseudo-random noise code of PRN generator 26 is shifted to a timing relationship with respect to the identical code generated by PRN generator 16, to result in correlation. Correlation is indicated when an output signal of integrator 30 exceeds the threshold voltage of source 34.

Figure 5:
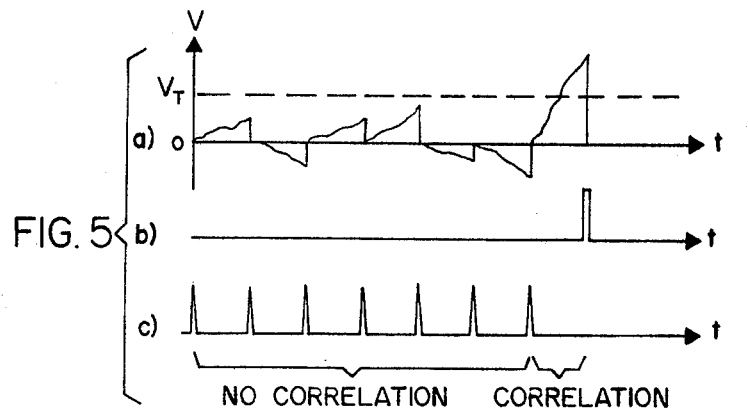
FIG. 5 is a graphical illustration of waveforms and to explain the operation of the prior art system of FIG. 4.

The operation of the apparatus in FIG. 4 is represented by the three waveforms (a), (b), and (c) of FIG. 5. Waveform (a) represents the output of integrator 30 over a sequence of seven integration periods. The level Vt represented by the dotted line in waveform (a) of FIG. 5, is the threshold voltage level of source 34. The first six integration periods represented in waveform (a) of FIG. 5 illustrate the behavior of the output signal of integrator 30 when no correlation exists between the two PRN codes. Because of the random statistical nature of the received signal and the lack of synchronization between the two codes, the output of the integrator is relatively low and may be either positive or negative with respect to the zero voltage axis. However, when the two codes are synchronized, the output of the integrator 30 rapidly builds up to a level higher than the threshold value Vt at a rate dependent upon the signal-to-noise ratio of the incoming information. An integrator output signal greater than Vt is indicative of correlation and thus substantial synchronization between the two PRN codes.

Waveforms (b) and (c) of FIG. 5, respectively, represent a signal indicating that acquisition has been achieved and a signal indicating the lack of correlation up to acquisition. For purposes of clarity, the devices used specifically to generate the signals represented by waveforms (b) and (c) of FIG. 5 are not shown in FIG. 4. However, it will be understood that waveform (b) of FIG. 5 is representative of a hit indication signal representative of the output of comparator 32, using simple logic which acts on that output. It will also be understood that the non-correlation pulses represented by waveform (c) of FIG. 5 may be generated by simple logic to produce a pulse each time the fixed time reset device 36 resets the integrator, but only when the output of the comparator 32 indicates that the threshold has not been reached or exceeded. Typically, the non-correlation pulses of waveforms (c) are applied to PRN generator 26 to produce the half-chip steps previously mentioned, while the pulse of waveform (b) is applied to lock-in the generator without further changes in the code sequence after acquisition is achieved.

The detection scheme discussed in conjunction with FIGS. 4 and 5 represents an integrate and dump circuit having a fixed integration time algorithm. Another scheme or algorithm in the prior art that is used to achieve synchronization between two PRN generated codes, is the sequential detection apparatus represented in FIGS. 6 and 7.

Figure 6:
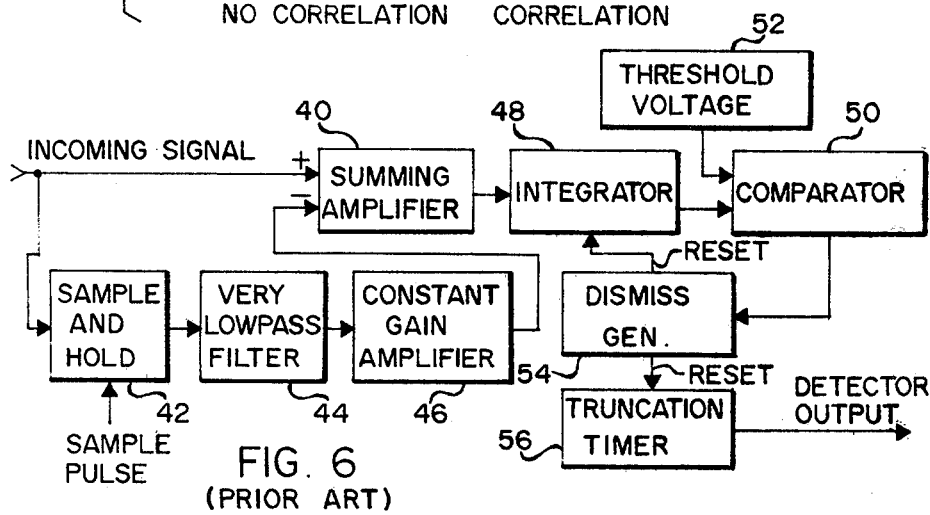
FIG. 6 is a simplified block diagram illustration of a prior art sequential threshold detector circuit.

The prior art detector of FIG. 6 comprises a summing amplifier 40, a sample and hold circuit 42, a very low-pass filter 44, a constant gain amplifier 46, an integrator 48, a comparator 50, a threshold voltage source 52, a dismiss generator 54, and a truncation timer 56.

As in the fixed-time integration detector of FIG. 4, in the sequential threshold detector of FIG. 6, an incoming signal is applied to an integration and dump circuit. However, a bias voltage is first added to the incoming signal in summing amplifier 40. The bias voltage is derived from the incoming signal by passing that signal through a sample and hold circuit 42, very low-pass filter 44 and constant gain amplifier 46. The output of amplifier 46 is a bias signal which is proportional to the average value of the incoming signal when no correlation exists. This bias signal is applied to the negative teminal of summing amplifier 40. Sample and hold circuit 42 is enabled by a sample pulse which occurs only when it is known that correlation does not exist. This definite state of non-correlation is achieved in typical embodiments of spread-spectrum receivers by employing a PRN waveform intentionally not correlated to the transmitter PRN code only while the sample pulse is applied to sample and hold circuit 42.

Amplifier 40 substracts the bias level at its negative input from the incoming signal at its positive input and the resultant difference signal is applied to the input of integrator 48. The output signal of integrator 48 is applied to comparator 50, to which a threshold voltage from source 52 is also applied. However, because of the negative bias applied to the incoming signal in summing amplifier 40, in the absence of code correlation, the integrator output always varies between zero volts and a negative voltage. Accordingly, unlike the detector represented in FIG. 4, in the detector of FIG. 6, the threshold voltage is negative, and the output signal of comparator 50 changes state when the integrator output signal exceeds the threshold voltage level in a negative direction.

Comparator 50 operates in the same manner as previously described for comparator 32 of the block diagram presented in FIG. 4. More specifically, comarator 50 produces an output signal having a polarity or lever in one state when the output signal from integrator 48 is less negative than threshold voltage source 52 and in the opposite state when the integrator signal level is more negative than the threshold voltage level. The output of comparator 50 is applied to dismiss generator 54, the operation of which will be more fully understood hereinafter in conjunction with the description of FIG. 7. The dismiss generator is connected both to the reset terminal of integrator 48 and to truncation timer 56, from which the detector output signal is derived.

Figure 7:
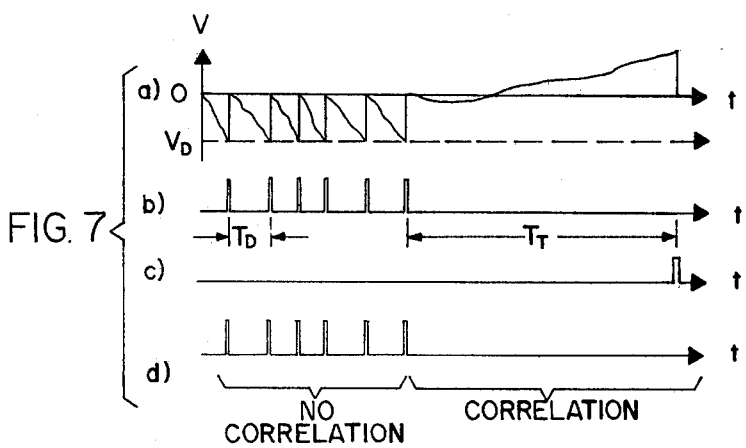
FIG. 7 is a graphical illustration of waveforms used to explain the operation of the prior art detector of FIG. 6.

Waveforms (a), (b), (c), and (d) of FIG. 7 more fully indicate the manner in which the sequential detector of FIG. 6 operates. Waveform (a) represents the output signal of integrator 48 over which is superimposed the threshold voltage Vd represented by the dotted line in waveform (a). Because of the addition of the negative bias voltage into summing amplifier 40, integrator 48 tends to integrate in a negative direction when the PRN code of the receiver is not synchronized with the PRN code of the transmitter, or in other words, when no correlation exists. The output signal of integrator 48 eventually reaches the threshold level Vd provided by threshold voltage source 52. At the time integrator 48 produces an output signal that equals the voltage level of source 52, the output signal of comparator 50 changes state as previously described. The output signal of comparator 50 is applied to dismiss generator 54 which, upon receiving the comparator signal indicating equality between the integrator output and the threshold voltage source output, resets integrator 48 to repeat the process with the code stepped ½ chip. Waveform (a) of FIG. 7 shows, by way of example, this process being repeated six times wherein each such time the integrator output eventually reaches the threshold level Vd resulting in the generation of a dismiss pulse. The corresponding series of six dismiss pulses are shown in waveform (b). Each time the process is repeated, the PRN code is shifted by ½ chip to test for correlation between the two codes until synchronization is achieved.

When a sufficient number of ½ chip shifts have been made to place the receiver PRN code in substantial synchronization with the transmitter PRN code, sufficient correlation exists to prevent the output signal of integrator 48 from reaching the threshold level Vd, despite the addition of the bias voltage to the incoming signal in summing amplifier 40. If the output signal of integrator 48 does not reach the threshold voltage Vd for a pre-selected period of time, referred to herein as the truncation time Tt, a dismiss pulse is not generated, indicating correlation exists and that the PRN code has been shifted a sufficient number of times to result in synchronization between the receiver code and the transmitter code. In this regard, waveform (c) of FIG. 7 indicates the occurrence of a hit indication or a detector output pulse beginning immediately subsequent to the termination of the truncation time Tt. Note that there are no similar pulses prior to that time during which no correlation existed or during which the truncation period Tt had not yet expired. Waveform (d) of FIG. 7 shows non-correlation pulses occurring simultaneously with the dismiss pulses of waveform (b) during the first six unsuccessful attempts to acquire synchronization. As in the case of fixed integration time algorithm of the detector of FIG. 4 and the corresponding waveforms of FIG. 5, the non-correlation pulses are used to step the PRN generator to achieve the proper time relationship between the receiver code and the transmitter code.

Thus, the detection scheme commonly referred to as sequential detection and represented in block diagram form in FIG. 6, differs from the concept of detection illustrated in FIG. 4 in the following three principal ways:

1. A negative bias voltage is added to the signal input to the integrator.
2. The threshold voltage, which is used to determine whether or not correlation has occured, is negative.
3. Correlation is assumed to have occurred when the threshold voltage has not been reached by the integrator output signal for a given period of time called the truncation time, Tt.

The above description pertaining to FIGS. 1 through 7 has dealt with general subject matter pertaining to the spread-spectrum process and with prior art detection schemes for acquiring synchronization between the pseudo-random noise code of a receiver with the corresponding pseudo-random noise code of a transmitter. The remaining FIGS. 8 through 12, pertain to various alternative embodiments of the present invention in which highly advantageous and novel improvements are provided in a sequential detection system that uses a variable integration time detection technique that operates on the principal of maintaining the median dismissal time Td at a pre-selected, optimum constant value.

Figure 8:
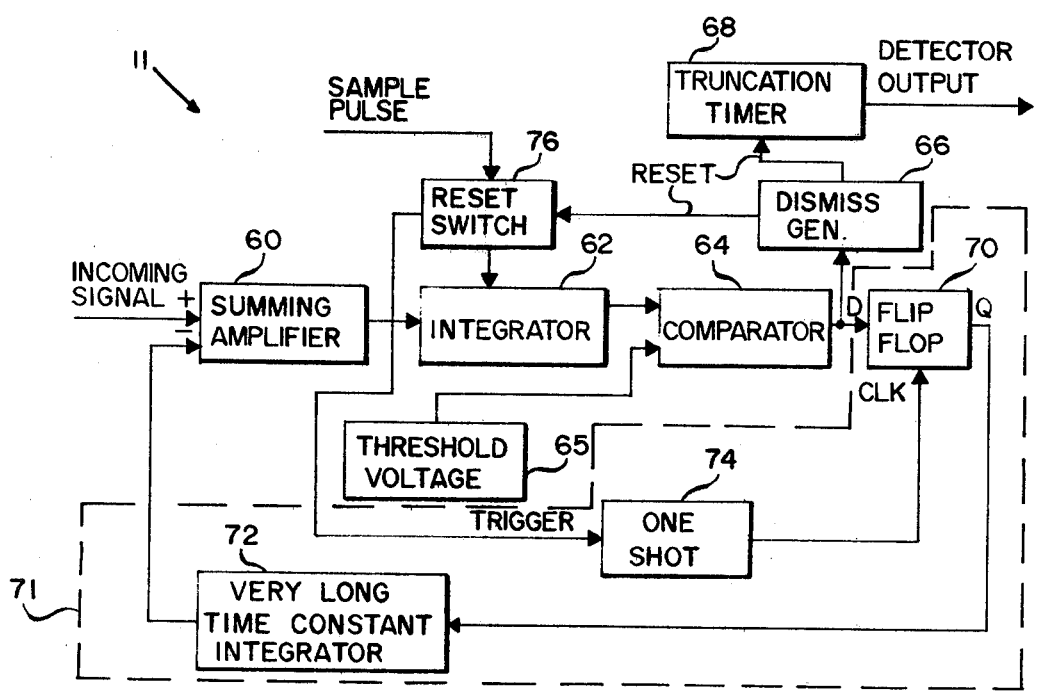
FIG. 8 is a block diagram illustration of a preferred embodiment of the present invention.

The sequential threshold detector 11 illustrated in FIG. 8 comprises a summing amplifier 60, an integrator 62, a comparator 64, a threshold voltage source 65, a dismiss generator 66, a truncation timer 68, a bias circuit 71, and a reset switch 76. Bias circuit 71 comprises a flip-flop 70, a very long time constant integrator 72, and a one-shot 74. An incoming signal is applied to the positive summing input of summing amplifier 60 which has a positive input and a negative input and which generates an output signal corresponding to the difference between the signals applied to its inputs. The output signal of summing amplifier 60 is applied to integrator 62. The output terminal of integrator 62 is connected to one input terminal of comparator 64. The other input terminal of comparator 64 receives a threshold voltage from threshold voltage source 65. The output terminal of comparator 64 is connected both to the input terminal of dismiss generator 66 and to the input of flip-flop 70. Dismiss generator 66 has a first output terminal connected to the truncation timer 68 and a second output terminal connected through the reset switch 76 to a reset terminal of integrator 62 and to the trigger input of one shot 74. The output of one shot 74 is connected to the clock terminal of flip-flop 70. The operation of reset switch 76 will be more fully described hereinafter. The Q output of flip-flop 70 is connected to integrator 72. The output of integrator 72 is connected to the negative input of summing amplifier 60. The output of truncation timer 68 provides the detector output which indicates when synchronization has been achieved.

Figure 9:
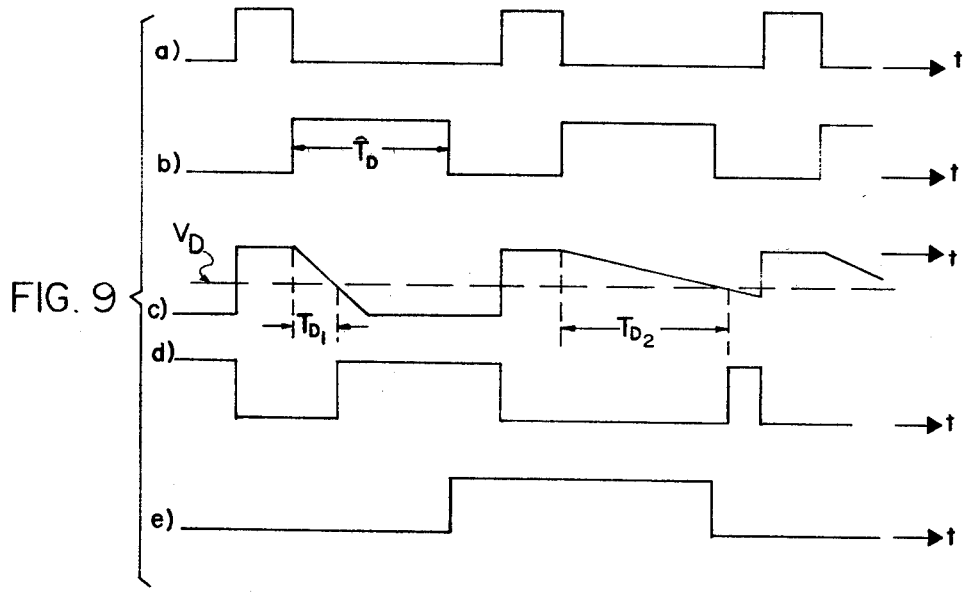
FIG. 9 is a graphical illustration of waveforms used to explain the operation of the embodiment of FIG. 8.

In operation, adjustment of the bias voltage input to the negative input of summing amplifier 60 takes place only during the occurrence of a sample pulse which is applied to reset switch 76. The sample pulse is applied only when a state of non-correlation is known to exist. The sample pulses generated by waveform (a) of FIG. 9, are applied at a fixed period to reset switch 76. Reset switch 76 applies the sample pulse both to the reset terminal of integrator 62 and to the trigger terminal of one-shot 74. At the same time, reset switch 76 disconnects the output terminal of dismiss generator 66 from the reset terminal of integrator 62, so that during the occurrence of the sample pulse, the reset mode of the integrator is controlled only by the sample pulse voltage. One-shot 74 generates a rectangular output signal having a positive voltage for a selected constant period of time which corresponds to the desired median dismissal time Td. This positive pulse generated by one-shot 74, commences immediately upon the downward transition of the sample pulse from its high state to its low state, as the sample pulse is applied to the trigger terminal of the one-shot. The transition of the sample pulse from its low state to its high state resets the integrator as represented by the waveform (c) of FIG. 9. During the high state of the sample pulse, the output of integrator 62 is at zero volts. During the high state of the sample pulse, the output signal of comparator 64 is in its low state, as represented by waveform (d) of FIG. 9, because the output signal of integrator 62 is less negative than the threshold voltage Vd generated by threshold voltage source 65. Vd is represented by the horizontal dotted line in waveform (c) of FIG. 9. Consequently, the signal at the date (D) terminal of flip-flop 70 is in its low state while the signal level of the output of integrator 62 is less negative than the threshold voltage Vd.

When the sample pulse is terminated, that is, when its voltage level returns to a zero state, integrator 62 is no longer held in a reset condition. Integrator 62 then begins to generate a negative-going ramp in the absence of correlation, because of the effect of the bias voltage at the negative input terminal to summing amplifier 60. Although this negative-going ramp is shown in waveform (c) of FIG. 9 to be straight line, it will be understood that this straight line represents the average value of the integrator output ramp, the instantaneous value of which varies randomly with the random characteristics of the incoming signal. When no correlation exists, the negative-going ramp voltage at the output terminal of integrator 62 eventually exceeds the threshold level Vd in a negative direction. When this event occurs, the output signal of comparator 64 changes state to a high level as represented in waveform (d) of FIG. 9. Consequently, the signal level applied to the D terminal of flip-flop 70 is then high as well. When the selected period of time for the positive state of the output signal of one-shot 74 has expired, the output signal of one-shot 74 changes state to a low level and this transition provides a clock pulse to the CLK terminal of flip-flop 70. Upon the occurrence of the trailing edge of this clock pulse, the output terminal Q of flip-flop 70 assumes the voltage level of the input signal applied to terminal D of the flip-flop. The output signal of terminal Q of flip-flop 70 is represented by waveform (e) in FIG. 9.

When the next sample pulse occurs, the process just described is repeated. More specifically, integrator 62 is reset at the positive going transition of the sample pulse and is then allowed to begin integrating upon the negative-going transition of the sample pulse. Also upon the negative-going transition of the sample pulse, one-shot 74 generates another positive-going pulse of selected constant duration equal to the desired median dismissal time Td. However, because of the high voltage state of the output terminal Q of flip-flop 70, which commenced prior to the second reset pulse indicated in waveform (a) of FIG. 9, the average value of the ramp voltage of integrator 62 has a lower slope. This lower slope results from very long time constant integrator 72, reducing the negative bias applied to the negative terminal of summing amplifier 60. Consequently, the dismissal time $T_{D2}$, measured between the negative-going transition of the second integrator output signal across the threshold value Vd, is greater than the previous dismissal time $T_{D1}$ corresponding to the first sample pulse of waveform (a) of FIG. 9.

Upon inspection of FIG. 9 it will be observed that the first dismissal time $T_{D1}$ is substantially shorter than the desired median dismissal time Td. As a result, the output signal of flip-flop 70 subsequently attains a high voltage level which changes the bias voltage in a direction to lengthen the dismissal time for the next sample pulse occurrence and produces a longer subsequent dismissal time $T_{D2}$. However, the second dismissal time $T_{D2}$ is longer than the desired median dismissal time Td. As a result, the output signal of comparator 64 does not make a positive transition until after the negative transition of the corresponding output signal of one-shot 74. Therefore, when the output of one-shot 74 makes a negative transition, thus applying the clock signal to the clock terminal CLK of flip-flop 70, the signal level at the D terminal of flip-flop 70 is in a low state and forces the signal level at the output terminal Q of flip-flop 70 to a low state as well. As a result, the bias voltage generated by very long time constant integrator 72, changes in the opposite direction and increases the slope of the average value of the integrator during the next subsequent ramp after the occurrence of the third sample pulse shown in waveform (a) of FIG. 9.

It will now be understood that during the periods between sample pulses, the sequential detection system of the present invention continued to operate with sequentially stepped PRN codes in an attempt to acquire synchronization between the PRN code of the receiver and the PRN code of the transmitter. Between each pair of sample pulses, the bias voltage applied to the negative terminal of summing amplifier 60 remains constant. However, when the sample pulse is generated, a modification of the bias voltage takes place in accordance with the process described above so that the dismissal time Td varies above and below the desired median dismissal time, whereby the desired median dismissal time is held substantially constant.

Between sample pulses, that is, during the period that the sequential detector of the present invention operates with a substantially fixed bias voltage, reset switch 76 connects the output terminal of the dismiss generator 66 to the reset terminal of the integrator 62. The detector continues to operate during such periods in the same manner as than described for the prior art detector of FIG. 6. Consequently, as in the prior art system, when the PRN codes are synchronized, sufficient correlation exists to prevent the integrator output signal from going negative or at least sufficiently negative to cross the threshold Vd. As a result, dismiss generator 66 does not reset the truncation timer 68 before the timer runs out and generates a pulse which indicates the occurrence of acquisition as previously described in conjunction with FIG. 6.

Figure 10:
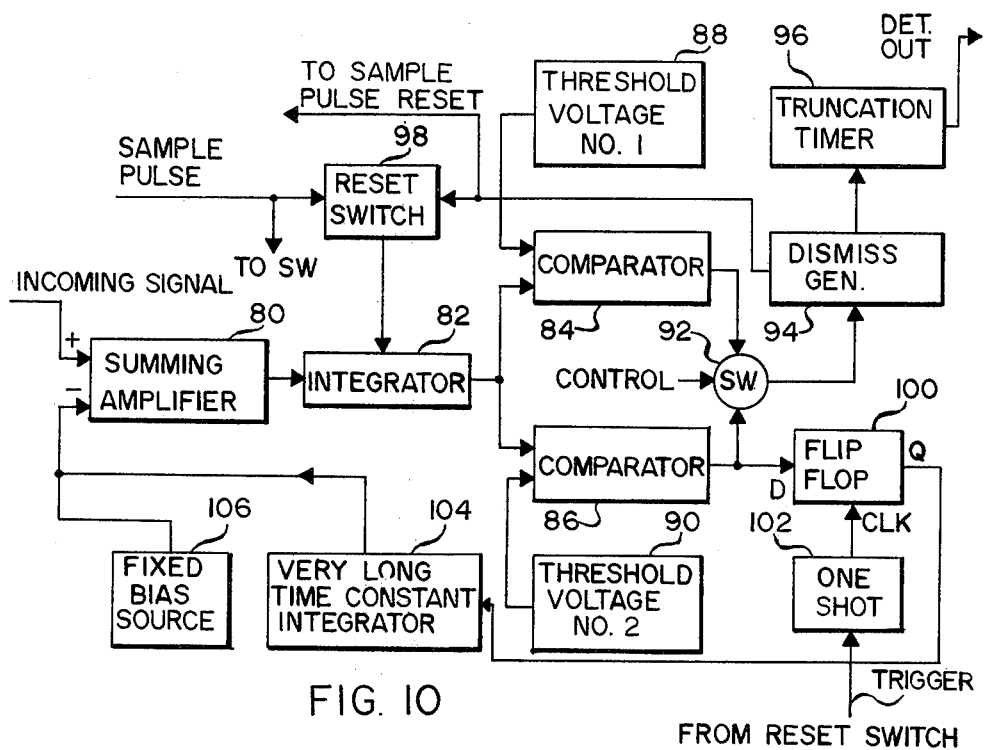
FIG. 10 is a block diagram illustration of an alternative embodiment of the present invention.
Figure 11:
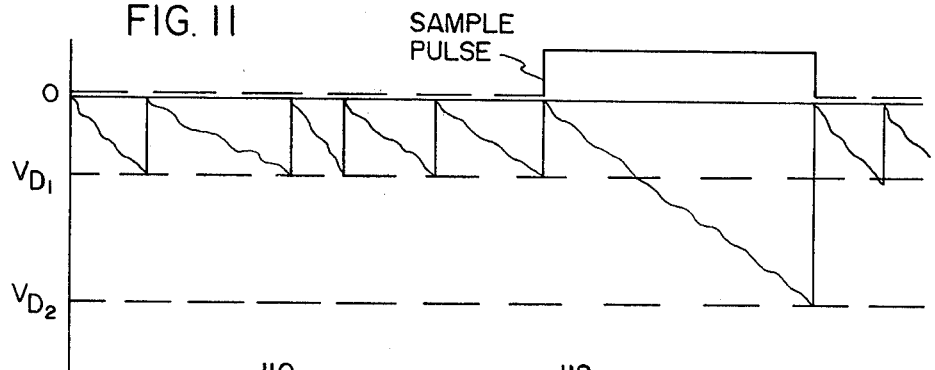
FIG. 11 is a graphical illustration of waveforms used to explain the operation of the detector of FIG. 10.

Reference will now be made to FIGS. 10 and 11 for description of an alternative embodiment of the present invention.

The alternative embodiment of FIG. 10 comprises a summing amplifier 80, an integrator 82, a pair of comparators 84 and 86, a pair of threshold voltage sources 88 and 90, a double-pole, single-throw switch 92, a dismiss generator 94, a truncation timer 96, a reset switch 98, a flip-flop 100, a one-shot 102, a very long time constant integrator 104, and a fixed bias source 106. Summing amplifier 80 has a positive input to which an incoming signal is applied and a negative input to which a bias voltage is applied. The output of summing amplifier 80 is applied to the input of integrator 82. However, the output signal of integrator 82 is applied concurrently to the two comparators 84 and 86. First threshold voltage source 88 applies the lower magnitude threshold voltage $V_{d1}$ to the second input of comparator 84. Similarly, second threshold voltage source 90 applies the higher magnitude threshold voltage $V_{d2}$ to the second input of comparator 86. The respective output terminals of comparators 84 and 86 are connected to the input terminals of double-pole, single-throw switch 92. The position of switch 92 is controlled by the voltage of a control terminal to which the sample pulse is applied. The output terminal of switch 92 is connected to the input terminal of dismiss generator 94.

The output terminal of comparator 86 is also connected to the D terminal of flip-flop 100 which operates in conjunction with one-shot 102 and very long time constant integrator 104 in the manner described previously in conjunction with FIG. 8. The output signal of infegrator 104 is combined with the signal provided by a fixed bias source 106 before being applied to the negative summing terminal of amplifier 80. Dismiss generator 94, truncation timer 96, and reset switch 98, each provide the same function and are adapted to operate in the same manner as previously described for those same functional blocks of FIG. 8.

Although the alternative embodiment of the invention illustrated in FIG. 10 utilizes the constant median dismissal time bias circuit of the embodiment illustrated in FIG. 8, there are three principal distinguishing characteristics of this alternative embodiment, each of which may be optionally implemented in the present invention. These three distinguishing characteristics are the following:

1. A fixed bias voltage is added to the variable bias voltage to provide means for more quickly achieving the desired range of bias voltage variation upon intial power-up than can be achieved using only an integrator, (such as integrator 72 of FIG. 8), as the source of negative bias voltage applied to the summing amplifier.
2. An additional output signal is derived from the dismiss generator and applied to the source of the sample pulse (not shown) to provide a means of resetting the sample pulse.
3. Two different threshold levels are utilized; one level of greater magnitude is used during bias voltage adjustment during the occurrence of the sample pulse, and a second threshold voltage level of lower magnitude is used during the remaining periods of operation of the detector when the attempt is made to achieve correlation.

As shown in FIG. 11, in operation, when the sample pulse voltage level is substantially 0 volts, the detection circuit operates in its normal acquisition mode with a fixed bias level utilizing the lower magnitude threshold voltage $V_{d1}$ to sequentially step through the PRN code phasing in search of acquisition. During this acquisition mode, the detection circuit operates with comparator 84 in the circuit as a result of the position of switch 92 which connects the output terminal of comparator 84 to the dismiss generator 94. However, periodically, when a sample pulse occurs as shown in FIG. 11, the bias voltage is changed in the same manner as that described for the first embodiment of the invention of FIG. 8, namely, as required to provide a constant median dismissal time Td. It has been found that by utilizing a higher threshold voltage $V_{d2}$, and thus a longer integration time, the inventive circuit of FIG. 10 more reliably compensates for variations in information bandwidth and noise spectrum over that longer period of the sample pulse. Thus, during the bias voltage variation portion of the operation of the detector circuit of FIG. 10, the high state of the sample pulse causes switch 92 to connect comparator 86 to dismiss generator 94 and to disconnect comparator 84 from the generator. It will be understood, however, that the manner in which the desired median dismissal time is maintained substantially constant, is precisely the same as that described previously in conjunction with FIGS. 8 and 9.

Figure 12:
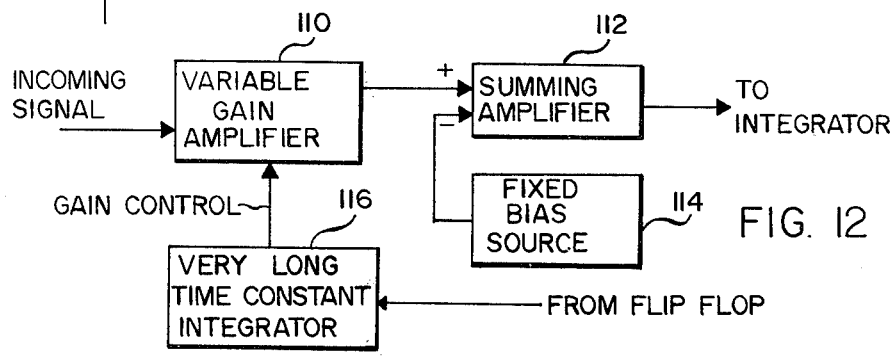
FIG. 12 is a block diagram illustration of a portion of an additional alternative embodiment of the present invention.

In the embodiment of FIG. 12, an incoming signal is input to a variable gain amplifier 110 before being input to a positive terminal of summing amplifier 112. As in the configuration of FIG. 10, the negative input of summing amplifier 112 is connected to receive a fixed bias voltage from a fixed bias source 114. However, unlike the previously described embodiments, in the alternative embodiment of FIG. 12, a very long time constant integrator 116 is connected as a gain control to variable gain amplifier 110 instead of being summed with the voltage output of fixed bias source 114 as in the embodiment of FIG. 10. When the alternative embodiment of FIG. 12 is utilized, the remaining portion of the detector circuit of the present invention may be either the configuration of FIG. 8 or the configuration of FIG. 10.

The embodiment of FIG. 12 still produces a substantially constant median dismissal time Td, but this is accomplished in a slightly different manner as compared to the previous embodiments. More specifically, in the modification of FIG. 12, the bias voltage is maintained constant, but the slope of the integrator to which summing amplifier 112 is connected, is, instead, varied in accordance with the gain of signal-plus-noise constituting the incoming signal. The gain is controlled by the output voltage level of very long time constant integrator 116. It has been found that by controlling the gain of the incoming signal path in this fashion, instead of changing the bias voltage at the summing amplifier 112, improved statistical characteristics are attained. More particularly, the average acquisition time for a given probability of detection is reduced, or in the alternative, the probability of detection is increased for a constant average acquisition time.

It will now be understood that what has been disclosed herein is a novel variable integration-time, sequential threshold detection circuit. Several embodiments have been disclosed, but each utilizes the principle of a feedback circuit that provides a voltage level dependence upon the dismissal time. The feedback circuit varies dismissal times so that the statistical median of dismissal times is held substantially constant.

It will also be understood that as a result of the novel improvements to variable integration-time, sequential threshold detection circuits provided by the present invention, several advantages are derived therefrom. By way of example, disadvantageous voltage offsets that are significant in prior art detection circuits and that result from aging of components and changes in ambient temperature are rendered irrelevant in the present invention. Furthermore, the present invention permits implementation of a variable integration-time, sequential threshold detector that utilizes fewer parts as compared to the prior art and thus results in reduced cost and improved reliability. Still an additional advantage of the present invention results from the obviation of fine grain adjustments required in prior art detectors. Such adjustments are inherently difficult and time consuming and require costly factory alignment.

For purposes of clarity and brevity, the applicant has disclosed his invention by means of block diagram representations of the various embodiments disclosed herein. However, those having ordinary skill in the art to which the present invention pertains will readily understand the manner in which each such block may be implemented for any given bandwidth, frequency of operation, and timing relationships, using well-known and readily available circuits such as large scale integration circuits, TTL circuits and the like.

Accordingly, it is to be understood that the present invention is not to be limited to any particular implementation of the various embodiments disclosed herein, nor to any particular parameters of sequential threshold detector operation. The present invention is to be limited only by the appended claims.

I claim:

1. In an improved sequential threshold detection apparatus for use in the receiver of a psuedo-random noise modulation spread-spectrum system having a transmitter and a receiver including respective matched pseudo-random code generators for modulating the transmitter output signal and demodulating the receiver input signal, respectively, in accordance with identical code sequences, an integrator for integrating the input signal, a comparator for comparing the integrated input signal with a pre-selected threshold voltage such that said integrated input signal has a first relationship to said threshold voltage when said code generators are not synchronized and a second relationship to said threshold voltage when said code generators are synchronized a generator for generating a reset pulse in response to said first relationship, and a truncation timer for generating a detector output pulse in response to the existence of said second relationship for a pre-selected time duration indicating synchronization between said code generators;

the improvement comprising:
means for applying a modifying voltage to said receiver input signal so as to modify its level;
means for maintaining said modifying voltage substantially constant over an acquisition period corresponding in time to a plurality of said reset pulses; and
means for alternately increasing and decreasing said modifying voltage during successive sample periods, respectively, to provide a substantially constant median time duration between successive reset pulses over a plurality of acquisition periods.

2. The improved apparatus recited in claim 1,
said means for modifying comprising:
   a differential amplifier having a positive input terminal adapted to receive said incoming signal, and having a negative input terminal to which said modifying voltage is applied;
said means for maintaining comprising:
   a long time constant integrator having an output terminal connected to said negative terminal, and having an input terminal; and
said means for periodically changing comprising:
   a bistable multivibrator having a data terminal connected to said output terminal of said comparator and having an output terminal connected to the input terminal of said long time constant integrator; and an astable multivibrator having a terminal for a pulse output signal of fixed time duration, said output terminal connected to the clock terminal of said bistable multivibrator, said astable multivibrator also having a trigger terminal for receiving a sample pulse during said sample period.

3. The improved apparatus recited in claim 1,
said means for modifying comprising:
   a variable gain amplifier having an input terminal for receiving said incoming signal and a gain control terminal to which said modifying voltage is applied;
said means for maintaining comprising:
   a long time constant integrator the output terminal of which is connected to said gain control terminal of said variable gain amplifier; and
said means for periodically changing comprising:
   a bistable multivibrator having its data terminal connected to the output terminal of said comparator and its output terminal connected to the input terminal of said long time constant integrator, and an astable multivibrator having a pulse output signal of fixed time duration equal to said substantially constant median time duration, having an output terminal connected to the clock terminal of said bistable multivibrator and having a trigger terminal for receiving a sample pulse during said sample period.

4. The improved apparatus recited in claim 1,
said means for modifying comprising:
   a differential amplifier having a positive input terminal to which said incoming signal is applied, and having a negative terminal to which said modifying voltage is applied;
said means for periodically changing comprising:
   a variable duty cycle oscillator having a duty cycle greater than 50% for increasing said modifying voltage and a duty cycle less than 50% for decreasing said modifying voltage.

5. The improved apparatus recited in claim 1,
said means for modifying comprising:
   a variable gain amplifier having an input terminal for receiving said incoming signal and a gain control terminal to which said modifying voltage is applied;
said means for periodically changing comprising:
   a variable duty cycle oscillator having a duty cycle greater than 50% for increasing said modifying voltage and a duty cyle less than 50% for decreasing said modifying voltage.

6. An improved sequential threshold detection apparatus for use in a receiver of a pseudo-random noise modulation spread-spectrum system, the system of the type having matched pseudo-random code generators in transmitter and receiver, respectively, the detection apparatus for the type having means for detecting whether or not the matched code generators are synchronized; the means for detecting comprising an integrator for receiving an incoming signal, a first comparator for ascertaining whether or not said integrated incoming signal has exceeded a first pre-selected threshold voltage indicating lack of synchronization between said code generators, a dismiss generator for generating a reset pulse when said first threshold voltage is so exceeded, and a truncation timer for generating a detector output pulse only when said threshold voltage is not so exceeded for a pre-selected time duration indicating the achievement of synchronization between said code generators;
the improvement comprising:
   means for modifying the level of said incoming signal by a modifying voltage;
   means for maintaining said modifying voltage substantially constant over an acquisition period corresponding to a plurality of said reset pulses; and
   means for periodically changing said modifying voltage during a sample period when it is known that synchronization between said code generators cannot occur;
   said changing means having a second comparator and a second pre-selected threshold voltage and means for alternately increasing and decreasing said modifying voltage during successive sample periods, respectively, and having means for controlling said increasing and decreasing to provide a substantially constant median time duration between successive reset pulses over a plurality of acquisition periods,
   the output terminals of said first and second comparators connected to respective input terminals of a double pole, single throw switch for alternately connecting said first and second comparators to said dismiss generator.

7. The improved apparatus recited in claim 6,
said means for modifying comprising:
   a differential amplifier having a positive input terminal to which said incoming signal is applied, and having a negative terminal to which said modifying voltage is applied;
said means for maintaining comprising:
   a long time constant integrator, the output terminal of which is connected to said negative terminal of said differential amplifier; and
said means for periodically changing comprising:
   a bistable multivibrator having its data terminal connected to the output terminal of said comparator and its output terminal connected to the input terminal of said long time constant integrator, and as astable multivibrator having a pulse output signal of fixed time duration equal to said substantially constant median time duration, having an output terminal connected to the clock terminal of said bistable multivibrator and having a trigger terminal for receiving a sample pulse during said sample period.

8. The improved apparatus recited in claim 6,
said means for modifying comprising:

a variable gain amplifier having an input terminal for receiving said incoming signal and a gain control terminal to which said modifying voltage is applied;
said means for maintaining comprising:
a long time constant integrator the output terminal of which is connected to said gain control terminal of said variable gain amplifier; and
said means for periodically changing comprising:
a bistable multivibrator having its data terminal connected to the output terminal of said comparator and its output terminal connected to the input terminal of said long time constant integrator, and an astable multivibrator having a pulse output signal of fixed time duration equal to said substantially constant median time duration, having an output terminal connected to the clock terminal of said bistable multivibrator and having a trigger terminal for receiving a sample pulse during said sample period.

9. The improved apparatus recited in claim 6, said means for modifying comprising:
a differential amplifier having a positive input terminal to which said incoming signal is applied, and having a negative terminal to which said modifying voltage is applied;
said means for periodically changing comprising:
a variable duty cycle oscillator having a duty cycle greater than 50% for increasing said modifying voltage and a duty cycle less than 50% for decreasing said modifying voltage.

10. The improved apparatus recited in claim 6, said means for modifying comprising:
a variable gain amplifier having an input terminal for receiving said incoming signal and a gain control terminal to which said modifying voltage is applied;
said means for periodically changing comprising:
a variable duty cycle oscillator having a duty cycle greater than 50% for increasing said modifying voltage and a duty cycle less than 50% for decreasing said modifying voltage.

11. In an improved sequential threshold detection appratus for use in a receiver of a pseudo-random noise modulation spread-spectrum system, said detection apparatus of the type having means for summing an incoming pseudo-random noise modulated signal and a bias voltage; a first integrator for receiving the summed incoming signal and bias voltage; having a comparator for receiving the output signal of said first integrator and a fixed threshold voltage and for generating at an output terminal a signal of a first level when said first integrator output signal exceeds said threshold voltage and a signal of a second level when said threshold voltage equals or exceeds said first integrator output signal; having a generator connected to the comparator for receiving said comparator-generated signals and connected to said first integrator for resetting the first integrator upon the occurrence of said second level signal of the comparator; having a truncation timer for generating a detector output signal only when said comparator-generated signal remains at the first level for a pre-selected period of time; and having a bias circuit for generating said bias voltage and for adjusting said bias voltage to a level dependent upon the amplitude of said incoming signal during the occurrence of a sample pulse;
the improvement comprising:
a bistable multivibrator having an input data terminal, an output data terminal, and a clock terminal;
an astable multivibrator having a trigger terminal and an output terminal, and having a pulse duration equal to a pre-selected constant; and
a second integrator having an input terminal and an integration output terminal;
said input data terminal of said bistable multivibrator being connected to said output terminal of said second comparator,
said output data terminal of said bistable multivibrator being connected to said input terminal of said second integrator, and said clock terminal of said bistable multivibrator being connected to said output terminal of said astable multiibrator;
said trigger terminal of said astable multivibrator being connected to receive said sample pulse, and said integration output terminal of said second integrator providing said bias voltage;
whereby said bias voltage varies during each said sample pulse and said bias voltage variation causes the median time duration between said occurrences of said second level signal of said comparator to be substantially equal to said pre-selected constant pulse duration of said astable multivibrator.

12. In an improved sequential threshold detection apparatus for use in a receiver of a pseudo-random noise modulation spread-spectrum system, said detection apparatus of the type having means for summing an incoming pseudo-random noise modulated signal and a bias voltage; a first integrator for receiving the summed incoming signal and bias voltage; having first and second comparators for receiving said output signal of the first integrator and first and second fixed threshold voltages and for generating at an output terminal a signal of a first level when said first integrator output signal exceeds said first or second threshold voltage, respectively, and a signal of a second level when said first threshold voltage equals or exceeds said first or second integrator output signal, respectively; having a dismiss generator to be connected to the first comparator for receiving said first comparator-generated signals and connected to said first integrator for resetting said first integrator upon the occurrence of said second level signal of said first or second comparator; having a truncation timer for generating a detector output signal only when said first or second comparator-generated signal remains at said first level for a pre-selected period of time; and having a bias circuit for generating said bias voltage and for adjusting said bias voltage to a level dependent upon the amplitude of the incoming signal during the occurrence of a sample pulse;
said improvement comprising:
a bistable multivibrator having an input data terminal, an output data terminal, and a clock terminal;
an astable multivibrator having a trigger terminal and an output terminal, and having a pulse duration equal to a pre-selected constant; and
a second integrator having an input terminal and an integration output terminal;
said input data terminal of said bistable multivibrator being connected to said output terminal to said second comparator,
said output data terminal of said bistable multivibrator being connected to said input terminal of said second integrator, and said clock terminal of said bistable multivibrator being connected to said output terminal of said astable multivibrator;

said trigger terminal of said astable multivibrator being connected to receive said sample pulse, and said integration output terminal of said second integrator providing said bias voltage;

the output terminals of said first and second comparators connected to respective input terminals of a double-pole, single throw switch interposed between said comparators and said dismiss generator for alternately connecting said first and second comparators to said dismiss generator, whereby said bias voltage varies during each said sample pulse and said bias voltage variation causes said median time duration between said occurrences of said second level signal of said comparator to be substantially equal to said preselected constant pulse duration of said astable multivibrator.

* * * * *